(12) United States Patent
Tamura

(10) Patent No.: US 9,391,259 B2
(45) Date of Patent: Jul. 12, 2016

(54) PIEZOELECTRIC VIBRATING PIECE AND PIEZOELECTRIC VIBRATOR

(71) Applicant: SII Crystal Technology Inc., Chiba-shi, Chiba (JP)

(72) Inventor: Masanori Tamura, Chiba (JP)

(73) Assignee: SII CRYSTAL TECHNOLOGY INC., Chiba (JP)

(*) Notice: Subject to any disclaimer, the term of this patent is extended or adjusted under 35 U.S.C. 154(b) by 0 days.

(21) Appl. No.: 14/639,705

(22) Filed: Mar. 5, 2015

(65) Prior Publication Data

US 2015/0255700 A1 Sep. 10, 2015

(30) Foreign Application Priority Data

Mar. 6, 2014 (JP) ................. 2014-044150

(51) Int. Cl.
*H03H 9/21* (2006.01)
*H01L 41/053* (2006.01)
*H01L 41/047* (2006.01)
*H03H 9/17* (2006.01)
*H03H 9/10* (2006.01)

(52) U.S. Cl.
CPC .......... *H01L 41/053* (2013.01); *H01L 41/0475* (2013.01); *H03H 9/1021* (2013.01); *H03H 9/17* (2013.01); *H03H 9/21* (2013.01)

(58) Field of Classification Search
CPC ................. H03H 9/21; H03H 9/215
USPC ........................................... 310/370
See application file for complete search history.

(56) References Cited

U.S. PATENT DOCUMENTS

2014/0022024 A1* 1/2014 Yamada ............... H03B 5/30
331/68

FOREIGN PATENT DOCUMENTS

| JP | 2002141770 A | * | 5/2002 |
| JP | 2003-163568 A | | 6/2003 |
| JP | 2006-345517 A | | 12/2006 |

* cited by examiner

Primary Examiner — J. San Martin
(74) Attorney, Agent, or Firm — Brinks Gilson & Lione

(57) ABSTRACT

To provide a piezoelectric vibrating piece capable of preventing short circuit at the time of mounting caused by miniaturization. In a piezoelectric vibrating piece having a support arm portion provided with mount electrodes between a pair of vibrating arm portions, a layout wiring connected to the first mount electrode on the base end side of the support arm portion is formed on a mount surface, and at least a layout wiring passing the vicinity of the first mount electrode in the layout wirings connected to the second mount electrode on the tip side of the support arm portion is formed on an opposite mount surface side, thereby preventing short circuit of a conductive adhesive for bonding the first mount electrode to an electrode on the package side with respect to the layout wiring on the second mount electrode side.

6 Claims, 11 Drawing Sheets

PIEZOELECTRIC VIBRATING PIECE AND PIEZOELECTRIC VIBRATOR

RELATED APPLICATIONS

This application claims priority under 35 U.S.C. §119 to Japanese Patent Application No. 2014-044150 filed on Mar. 6, 2014, the entire content of which is hereby incorporated by reference.

BACKGROUND OF THE INVENTION

1. Field of the Invention

The present invention relates to a piezoelectric vibrating piece and a piezoelectric vibrator having the same.

2. Description of Related Art

For example, in a cellular phone and portable information terminal apparatuses, a piezoelectric vibrator using crystal and so on is used in many cases as devices used for a time source, a timing source of a control signal and so on, a reference signal source and so on. As a piezoelectric vibrator of this kind, there is known one in which a piezoelectric vibrating piece is hermetically sealed in a package where a cavity is formed.

A so-called center-arm type piezoelectric vibrating piece is known as a piezoelectric vibrating piece (for example, refer to JP-A-2003-163568 (Patent Document 1) and JP-A-2006-345517 (Patent Document 2)). The center-arm type piezoelectric vibrating piece has a pair of vibrating arm portions arranged in parallel to each other at an interval in a width direction, a base portion supporting a base-end portion side of the pair of vibrating arm portions in a cantilever manner and a support arm portion (center arm) extended from the base portion between the pair of vibrating arm portions. Then, the piezoelectric vibrating piece is mounted inside a package by using the support arm portion as a mount portion. Specifically, two mount electrodes provided on the surface of the support arm portion are bonded to electrode pads on a package side through a conductive bonding material such as a conductive adhesive or metal bumps. Accordingly, the piezoelectric vibrating piece can be mounted in the package as well as a voltage can be applied from outside to excitation electrodes on the vibrating arm portions.

In the piezoelectric vibrating piece of this kind, two mount electrodes provided on one surface (mount surface) in a thickness direction of the support arm portion and two-system excitation electrodes provided on respective vibrating arm portions are respectively connected through two-system layout electrodes formed via the base portion. The respective mount electrodes are arranged at an interval in a longitudinal direction of the support arm portion for securing respective insulation properties of the two mount electrodes. Therefore, the layout electrodes connected to the mount electrode positioned on a tip side of the support arm portion pass near the mount electrode positioned on the base end side of the support arm portion on the surface of the support arm portion.

According to the above, the conductive bonding material used for bonding the mount electrodes positioned on the base end side of the support arm portion is squeezed and wet-spread at the time of mounting the piezoelectric vibrating piece onto the package, which causes a risk of short circuit in the layout electrodes connected to the mount electrode positioned on the tip side of the support arm portion. The risk is increased particularly when the width dimension of the support arm portion is reduced for satisfying the requirement for miniaturization of the piezoelectric vibrating piece.

In this respect, the layout electrodes of two mount electrodes are respectively formed on side end surfaces which face each other in a width direction of the support arm portion in the piezoelectric vibrating piece described in Patent Document 2, therefore, the risk may be reduced to some degree.

However, even when the layout electrodes of two mount electrodes are respectively formed on side end surfaces which face each other in the width direction of the support arm portion as in the piezoelectric vibrating piece described in Patent Document 2, there is a possibility that the conductive bonding material on the mount electrodes is squeezed and wet-spread at the time of mounting the piezoelectric vibrating piece onto the package to reach the side end surfaces in the width direction of the support arm portions. In such case, there still exists the risk of short circuit in the layout electrodes connected to the mount electrode positioned on the tip side of the support arm portion due to the conductive bonding material for bonding the mount electrode positioned on the base end side of the support arm portion.

SUMMARY OF THE INVENTION

The present invention has been made for solving the above problems, and an object thereof is to provide a piezoelectric vibrating piece capable of preventing short circuit at the time of mounting caused by miniaturization and a piezoelectric vibrator including the same.

In order to achieve the above object, the present invention applies the following means.

According to embodiments of the present invention, there is provided a piezoelectric vibrating piece including a pair of vibrating arm portions, a base portion to which respective base end sides of the pair of vibrating arm portions are fixed, a support arm portion connected to the base portion between the pair of vibrating arm portions and extending from the base portion to the same side as the pair of vibrating arm portions, excitation electrodes formed in the vibrating arm portions, two mount electrodes arranged at an interval in a longitudinal direction of the support arm portion in the same surface as the support arm portion, which are bonded to electrode pads on a substrate through a conductive adhesive and a first and second layout electrodes connecting the mount electrodes to the excitation electrodes via the base portion, in which the first layout electrode connecting to one mount electrode arranged on the tip side of the support arm portion in the two mount electrodes passes on a reverse surface of the support arm portion to connect one mount electrode to the excitation electrode.

According to the above structure, the first layout electrode connecting to one mount electrode arranged on the tip side of the support arm portion passes on the reverse surface of the support arm portion to connect one mount electrode to the excitation electrode. Accordingly, it is possible to connect one mount electrode to the excitation electrode while avoiding the bonding area of the conductive adhesive in the other mount electrode. That is, there is no danger of short circuit between the first layout electrode and the other mount electrode. In particular, even when the conductive adhesive of the other mount electrode is squeezed and wet-spread and the bonding range is spread to a wide range, the short circuit between the conductive adhesive and the first layout electrode can be prevented as the first layout electrode passes on the reverse surface of the support arm portion. As a result, it is possible to prevent short circuit between electrodes while increasing the strength in mounting the piezoelectric vibrating piece by setting the bonding area of the conductive adhesive to the wide range.

In the embodiment of the present invention, it is preferable that the first layout electrode passes an area on a reverse surface of the support arm portion and facing the conductive adhesive for bonding to the other mount electrode to connect the one mount electrode and the excitation electrode.

According to the above structure, the first layout electrode passes the area on the reverse surface of the support arm portion and facing the conductive adhesive for bonding to the other mount electrode, the contact between the first layout electrode and the conductive adhesive bonding to the other mount electrode can be possibly prevented.

In the embodiment of the present invention, it is preferable that the first layout electrode is laid out from the obverse surface to the reverse surface of the support arm portion via a side surface of the support arm portion.

According to the above structure, it is possible to obtain a desirable piezoelectric vibrating piece more easily as compared with a case where a through hole is formed in the support arm portion to lay out the layout electrode from the obverse surface to the reverse surface.

In the embodiment of the present invention, it is preferable that the conductive adhesive for bonding to the other mount electrode is bonded to the entire area in the width direction of the support arm portion.

According to the above structure, it is possible to increase the strength in mounting the piezoelectric vibrating piece on the substrate as the bonding area between the conductive adhesive and the support arm portion can be increased.

In the embodiment of the present invention, it is preferable that the mount electrode is formed over the entire area of the support arm portion in the width direction on the surface of the support arm portion.

According to the above structure, it is not necessary to perform positioning of the piezoelectric vibrating piece with respect to the substrate with high precision when the piezoelectric vibrating piece is mounted on the electrode pads on the substrate. Therefore, it is possible to improve the efficiency in the mounting work.

In the embodiment of the present invention, it is preferable that the conductive adhesive is bonded to the side surface of the support arm portion in addition to the surface of the support arm portion.

According to the above structure, the conductive adhesive reaches also the side surface of the support arm portion, therefore, the strength in mounting the piezoelectric vibrating piece on the package can be further increased.

Also according to the embodiment of the present invention, there is provided a piezoelectric vibrator in which the piezoelectric vibrating piece according the embodiment of the present invention is housed in a hermetically sealed cavity of a package, in which the two mount electrodes are bonded to the two electrode pads through the conductive adhesive, therefore, the piezoelectric vibrating piece is mounted on the package so that bonded portions are set as support fixing points and that other portions float from the package.

According to the present invention, it is possible to prevent short circuit at the time of mounting the piezoelectric vibrating piece caused by miniaturization.

DETAILED DESCRIPTION OF THE PREFERRED EMBODIMENTS

Hereinafter, embodiments of the present invention will be explained with reference to the drawings.
(Structure of Piezoelectric Vibrator)

Figure 1:
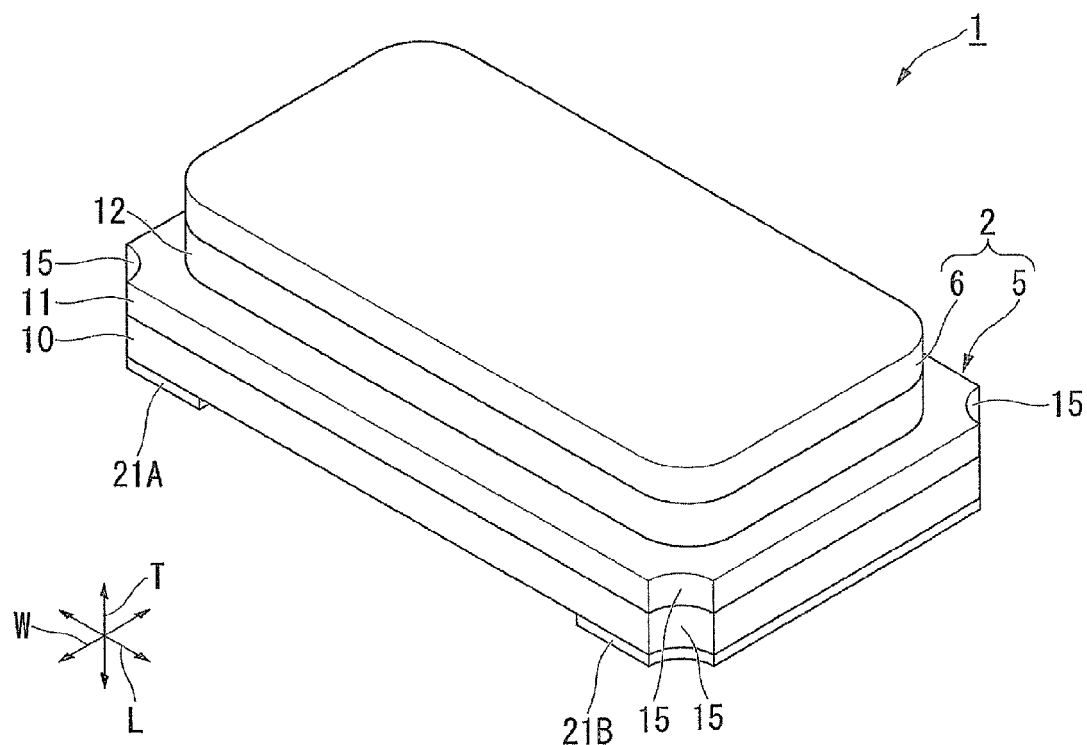
FIG. 1 is an external perspective view of a piezoelectric vibrator having a piezoelectric vibrating piece according to an embodiment of the present invention.
Figure 2:
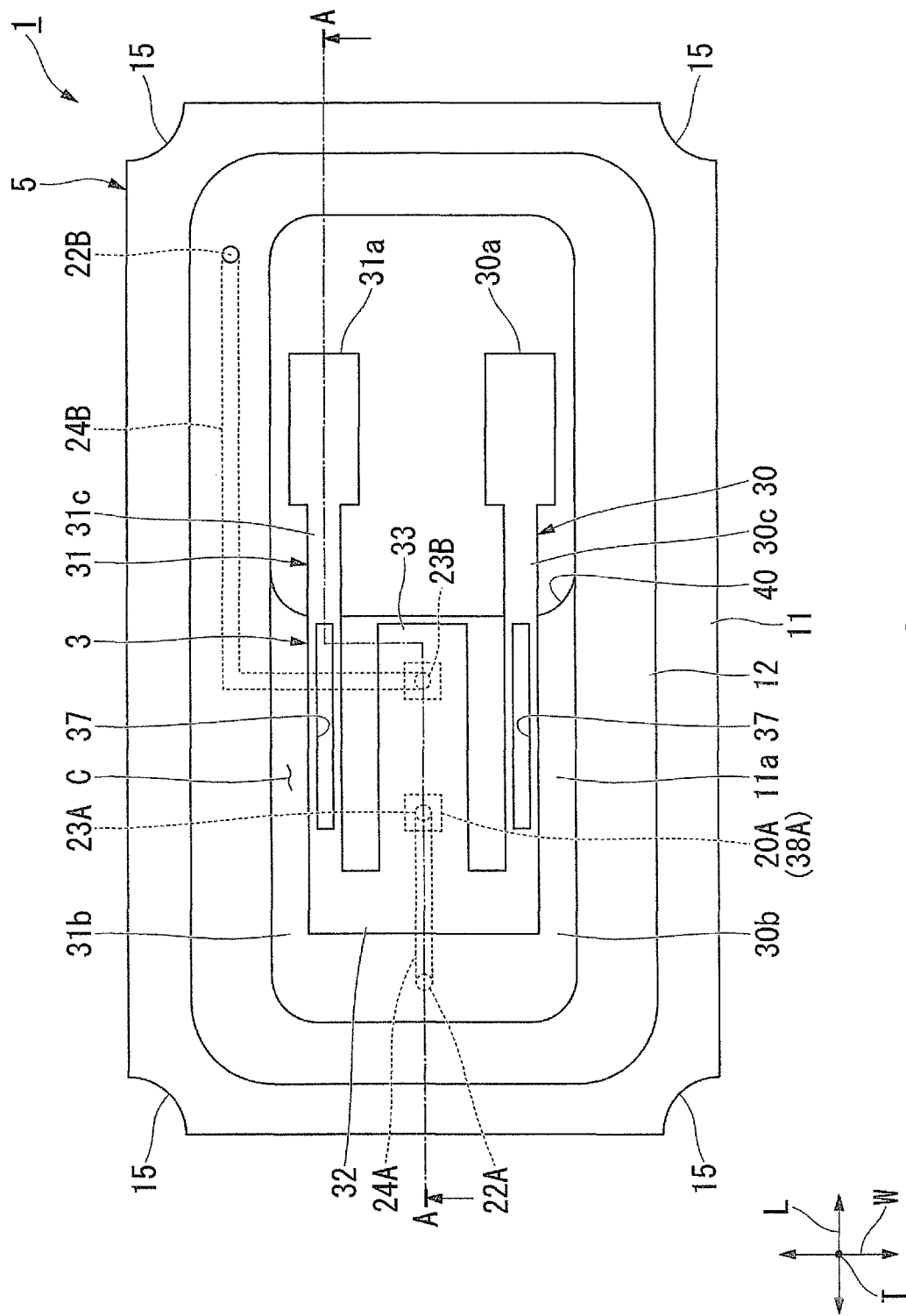
FIG. 2 is an internal structural view of the piezoelectric vibrator shown in FIG. 1, which is a view of the piezoelectric vibrating piece seen from above in a state of removing a sealing plate.
Figure 3:
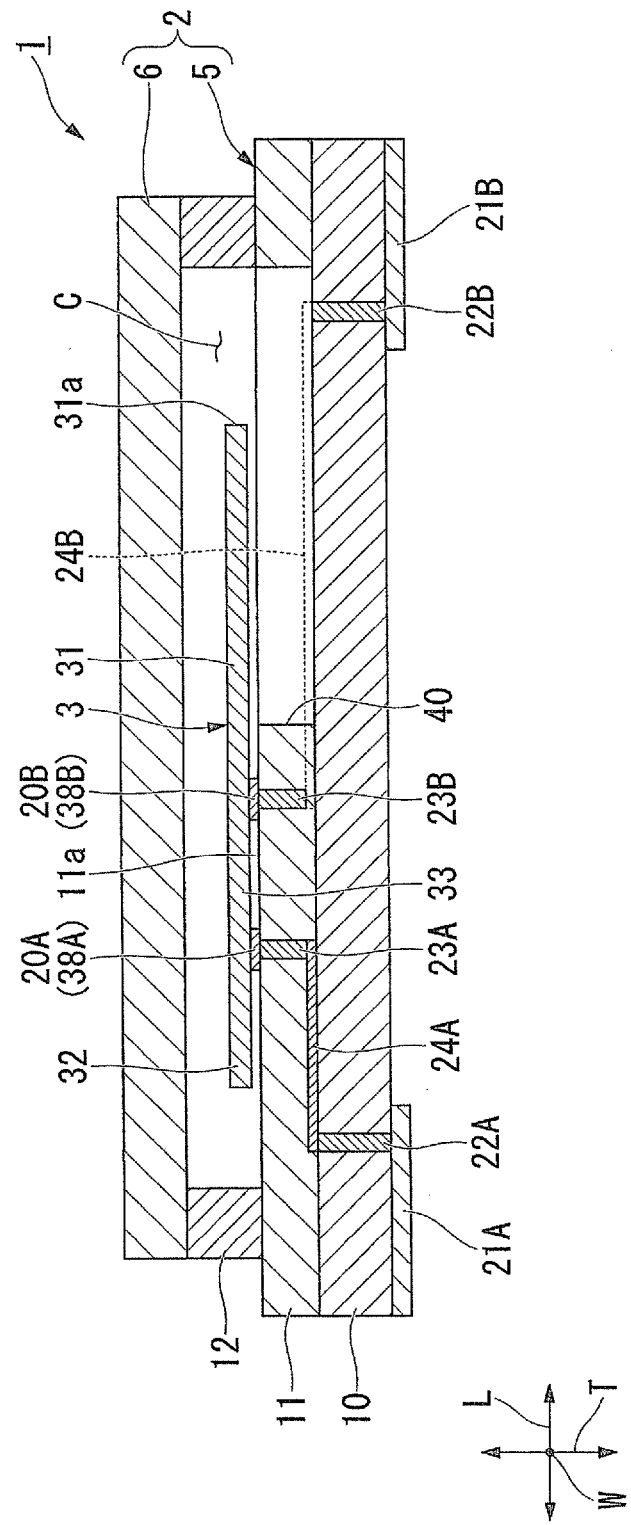
FIG. 3 is a cross-sectional view of the piezoelectric vibrator shown in FIG. 2 taken along A-A line.
Figure 4:
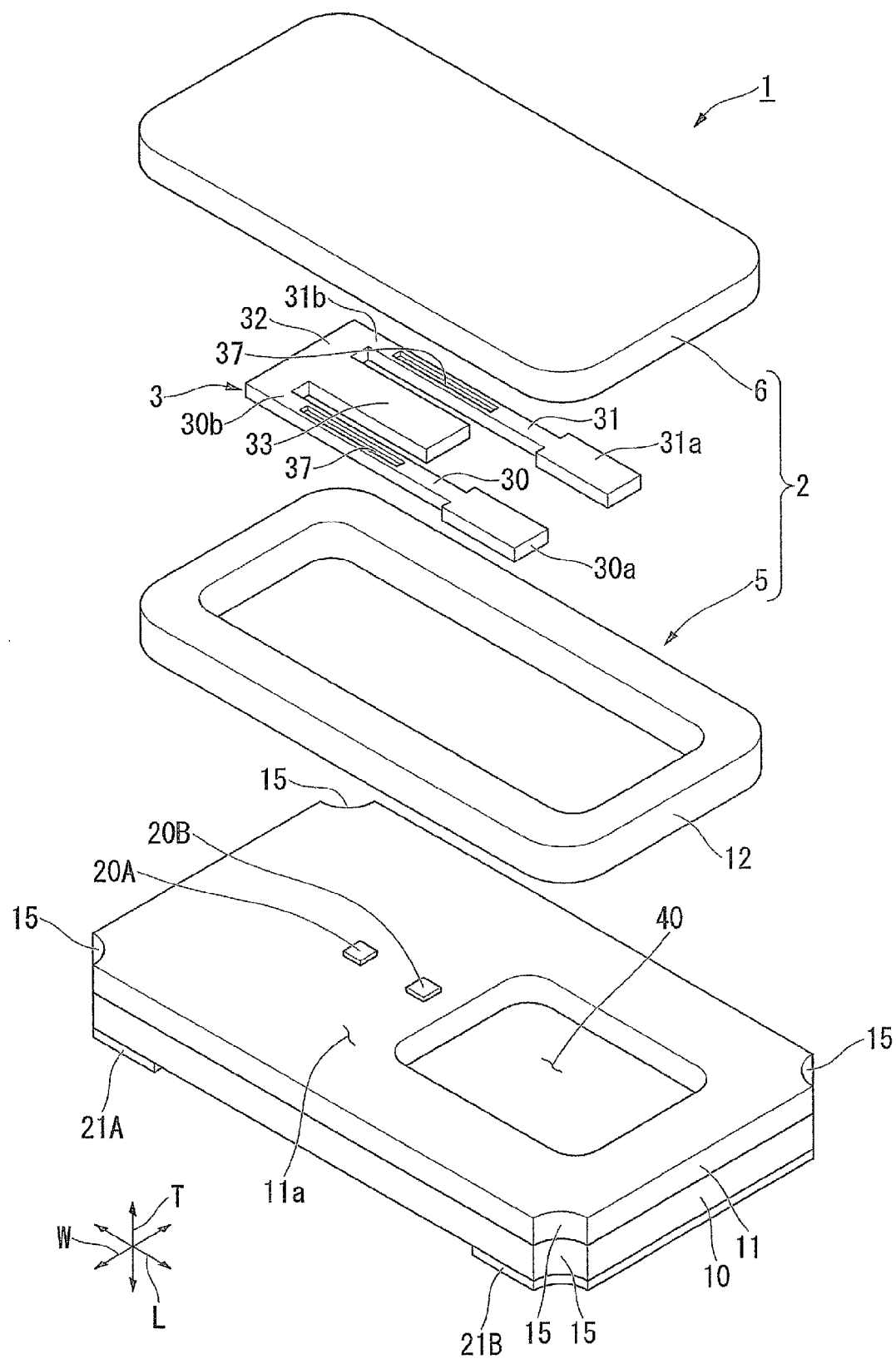
FIG. 4 is an exploded perspective view of the piezoelectric vibrator shown in FIG. 1.

FIG. 1 is an external perspective view of a piezoelectric vibrator, FIG. 2 is an internal structural view of the piezoelectric vibrator, which is a view of the piezoelectric vibrating piece seen from above in a state of removing a sealing plate, FIG. 3 is a cross-sectional view taken along A-A line of FIG. 2 and FIG. 4 is an exploded perspective view of the piezoelectric vibrator.

As shown in FIG. 1 to FIG. 4, a piezoelectric vibrator 1 according to the embodiment is a ceramic-package type surface mounted vibrator, which includes a package 2 having a hermetically sealed cavity C thereinside and a tuning-fork piezoelectric vibrating piece 3 housed in the cavity C. The piezoelectric vibrator 1 is formed in an approximately rectangular parallelepiped shape, in which a longitudinal direction of the piezoelectric vibrator 1 is defined as a longitudinal direction L, a short side direction is defined as a width direction W and a direction orthogonal to the longitudinal direction L and the width direction W is defined as a thickness direction T in a plan view in the present embodiment.

The package 2 includes a package body 5 and a sealing plate 6 bonded to the package body 5 and forming the cavity C with respect to the package body 5.

The package body 5 includes a first base substrate 10 and a second base substrate 11 bonded in an overlapping state, and a sealing ring 12 bonded onto the second base substrate 11.

The first base substrate 10 is a ceramic substrate formed in an approximately rectangular shape in a plan view. The second base substrate 11 is a ceramic substrate formed in the approximately rectangular shape in a plan view which is the same external shape as the first base substrate 10, which is integrally bonded in a state of overlapping with the first base substrate 10 by a method of sintering and the like.

At four corners of the first base substrate 10 and the second base substrate 11, notch portions 15 with a ¼ arc shape in a plan view are formed over the thickness direction T of both substrates 10 and 11. These first base substrate 10 and the second base substrate 11 are fabricated by bonding two pieces of wafer-shaped ceramic substrates in the overlapping state and forming plural through holes piercing both ceramic substrates in line, then, by cutting both ceramic substrates in a lattice state while using respective through holes as references. At this time, each through hole is divided into four, therefore, the notch portions 15 are formed.

An upper surface of the second base substrate 11 is a mount surface 11a corresponding to an inner wall on which the piezoelectric vibrating piece 3 is mounted.

The first base substrate 10 and the second base substrate 11 are made of ceramic. As specific ceramic materials, for example, HTCC (High Temperature Co-Fired Ceramic) made of aluminum, LTCC (Low Temperature Co-Fired Ceramic) made of glass ceramic and so on can be cited.

The sealing ring 12 is a conductive frame-shaped member which is slightly smaller than the external shape of the first base substrate 10 and the second base substrate 11, which is bonded to the mount surface 11a of the second base substrate 11. Specifically, the sealing ring 12 is bonded onto the mount surface 11a by baking using brazing materials such as silver brazing, a solder material and so on, or bonded by welding with respect to a metal bonding layer formed on the mount surface 11a (for example, by using deposition, sputtering and so on in addition to electroplating and electroless plating).

As materials of the sealing ring 12, for example, nickel based alloys and so on can be cited, specifically, the material can be selected from Kovar, Elinvar, Invar, 42-alloy and so on. In particular, it is preferable to select a material having a thermal expansion coefficient close to the first base substrate 10 and the second substrate 11 made of ceramic as the material of the sealing ring 12. For example, when alumina having a thermal expansion coefficient of $6.8 \times 10^{-6}/°$ C. is used as the first base substrate 10 and the second substrate 11, Kovar having a thermal expansion coefficient of $5.2 \times 10^{-6}/°$ C. or 42-alloy having a thermal expansion coefficient of 4.5 to $6.5 \times 10^{-6}/°$ C. is preferably used as the material of the sealing ring 12.

The sealing plate 6 is a conductive substrate overlapping with the sealing ring 12, which is hermetically bonded to the package body 5 by the bonding with respect to the sealing ring 12. Then, a space demarcated by the sealing plate 6, the sealing ring 12 and the mount surface 11a of the second base substrate 11 functions as the cavity C which is hermetically sealed.

As a method of welding the sealing plate 6, seam welding performed by, for example, contacting a roller electrode, laser welding, ultrasonic welding and so on can be cited. In order to allow the welding between the sealing plate 6 and the sealing ring 12 to be more secure, it is preferable that bonding layers made of nickel, gold or the like which are adaptable to each other are respectively formed at least on a lower surface of the sealing plate 6 and an upper surface of the sealing ring 12.

Incidentally, a pair of electrode pads 20A and 20B which are connecting electrodes with respect to the piezoelectric vibrating piece 3 are formed on the mount surface 11a of the second base substrate 11 at an interval in the longitudinal direction L as well as a pair of external electrodes 21A and 21B are formed on a lower surface of the first base substrate 10 at an interval in the longitudinal direction L. These electrode pads 20A and 20B and the external electrodes 21A and 21B are single layer films each made of a single metal formed by, for example, deposition, sputtering and the like, or laminated films formed by staking different metals, which are conducted with one another.

That is, in the first base substrate 10, one first through electrode 22A conducted to one external electrode 21A and piercing the first base substrate 10 in the thickness direction T is formed. In the second base substrate 11, one second through electrode 23A conducted to one electrode pad 20A and piercing the second base substrate 11 in the thickness direction T is formed. One connecting electrode 24A connecting one first through electrode 22A and one second through electrode 23A is formed between the first base substrate 10 and the second base substrate 11. Accordingly, one electrode pad 20A and one external electrode 21A are conducted to each other.

Also, in the first base substrate 10, the other first through electrode 22B conducted to the other external electrode 21B and piercing the first base substrate 10 in the thickness direction T is formed. In the second base substrate 11, the other second through electrode 23B conducted to the other electrode pad 20B and piercing the second base substrate 11 in the thickness direction T is formed. The other connecting electrode 24B connecting the other first through electrode 22B and the other second through electrode 23B is formed between the first base substrate 10 and the second base substrate 11. Accordingly, the other electrode pad 20B and the other external electrode 21B are conducted to each other.

The other connecting electrode 24B is patterned, for example, so as to extend below the sealing ring 12 along the sealing ring 12 for avoiding a later-described concave portion 40.

The concave portion 40 is formed at a portion facing tip ends 30a and 31a of a later-described pair of vibrating arm portions 30 and 31 of the piezoelectric vibrating piece 3 on the mount surface 11a of the second base substrate 11. The concave portion 40 is provided for avoiding contact with respect to the tip ends 30a and 31a of the vibrating arm portions 30 and 31 when the vibrating arm portions 30 and 31 are displaced (bending deformation) in the thickness direction T due to the effect of a shock such as a fall. The concave portion 40 is a through hole piercing the second base substrate 11 and formed in a square shape in a plain view with a curved four corners inside the sealing ring 12.

(Piezoelectric Vibrating Piece)

The piezoelectric vibrating piece 3 is a tuning-fork vibrating piece formed of a piezoelectric material such as crystal, lithium tantalite or lithium niobate, which vibrates when a given voltage is applied. The piezoelectric vibrating piece 3 includes the pair of vibrating arm portions 30 and 31 extending along the longitudinal direction L in parallel to each other, tip sides of which in the extending direction are free ends vibrating by using base-ends side as fixed ends, a base portion 32 extending in the width direction W, to which respective base ends 30b and 31b of the pair of vibrating arm portions 30 and 31 are integrally connected and fixed, and a support arm portion 33 connecting to the base portion 32 between the pair of vibrating arm portions 30 and 31 and extending from the base portion 32 to the same side as the vibrating arm portions 30 and 31.

The shape of the piezoelectric vibrating piece 3 is not limited to this, and can be a shape in which, for example, the vibrating arm portions 30 and 31 extend with an inclination of 5 degrees at the maximum with respect to the longitudinal direction L. According to the structure, it is possible to avoid interference between tip ends of the vibrating arm portions 30, 31 and an inner wall of the package housing the tip ends.

That is, the shape of the piezoelectric vibrating piece 3 is not particularly limited as long as there are the vibrating arm portions 30 and 31 provided at an interval in the width direction W of the base portion and the support arm portion 33 is provided therebetween.

The pair of vibrating arm portions 30 and 31 belong to a hammer head type, for example, in which a width dimension on tip ends 30a, 31a side is expanded as compared with the base ends 30b, 31b side, thereby increasing the weight of the tip ends 30a, 31a side of the vibrating arm portions 30, 31 and the moment of inertia at the time of vibration. Accordingly, the vibrating arm portions 30 and 31 are easily vibrated and the length of the vibrating arm portions 30 and 31 can be shortened, thereby reducing the size.

Note that the pair of vibrating arm portions 30 and 31 are not limited to the hammer head type.

The pair of vibrating arm portion 30 and 31 include groove portions 37 respectively formed along the longitudinal direction (extending direction) L of the vibrating arm portion 30 and 31 on both principal planes 30c and 31c which are both surfaces in the thickness direction T. The groove portions 37 are formed, for example, in a space from the base ends 30b, 31b side of the vibrating arm portion 30, 31 to approximately the center thereof in the longitudinal direction L.

Figure 5:
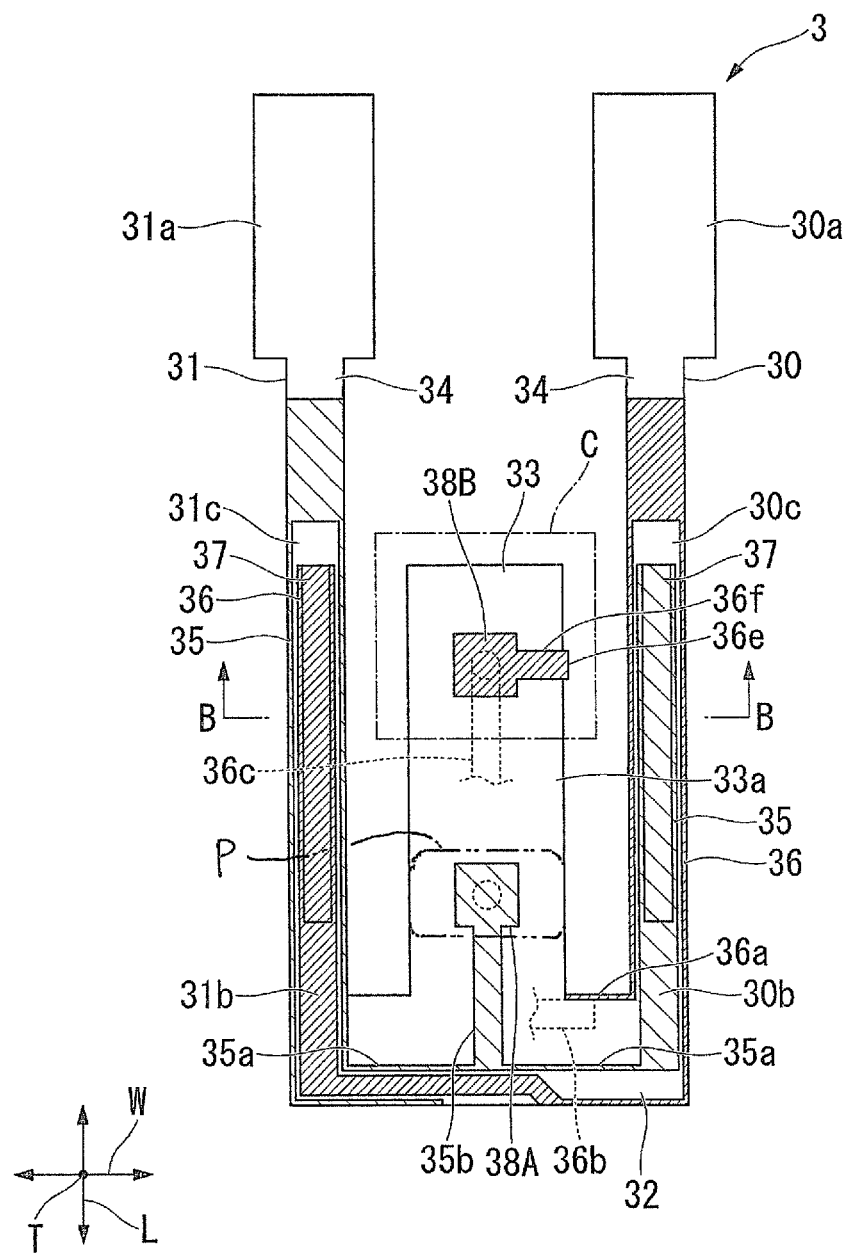
FIG. 5 is a plan view of the piezoelectric vibrating piece on the mount surface side according to the embodiment of the present invention.

FIG. 5 is a plan view of the piezoelectric vibrating piece on the mount surface side.

As shown in the drawing, the pair of vibrating arm portion 30 and 31 includes two systems of first and second excitation electrodes 35 and 36 which vibrate these vibrating arm portions 30 and 31 in the width direction W on the surface of a piezoelectric substance (piezoelectric plate 34) formed of a piezoelectric material. The first excitation electrode 35 and the second excitation electrode 36 are patterned on the pair of vibrating arm portions 30 and 31 in a state of being electrically insulated, which are arranged so as to vibrate the pair of vibrating arm portions 30 and 31 at a given frequency.

The detailed explanation will be made below.

Figure 6:
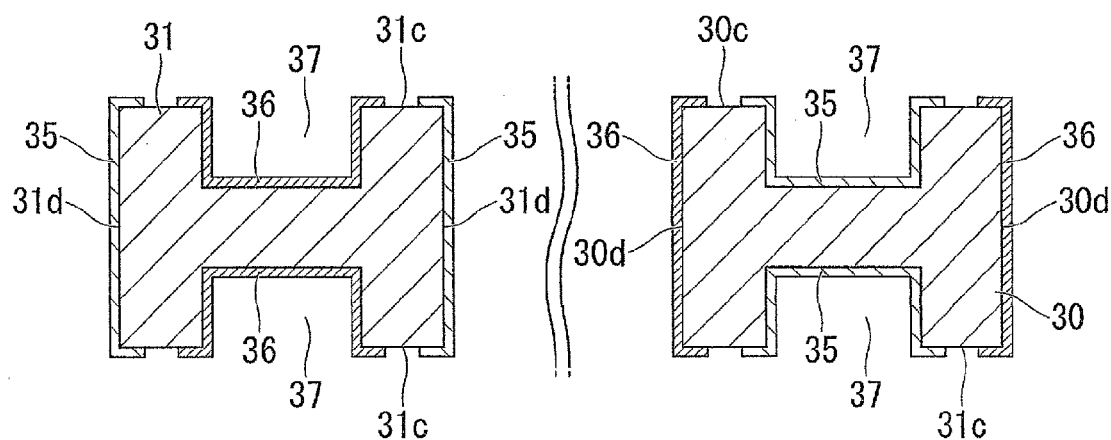
FIG. 6 is a cross-sectional view taken along B-B line of FIG. 5.

FIG. 6 is a cross-sectional view taken along B-B line of FIG. 5.

As shown in the drawing, for example, the first excitation electrode 35 is chiefly provided on the groove portion 37 of one (the right side of FIG. 6) vibrating arm portion 30 and on both side surfaces 31d of the other (left side of FIG. 6) vibrating arm portion 31 continuously along the longitudinal direction L as the extending direction of the vibrating arm portions 30 and 31 respectively. The second excitation electrode 36 is chiefly provided on both side surfaces 30d of one (the right side of FIG. 6) vibrating arm portion 30 and on the groove portion 37 of the other (left side of FIG. 6) vibrating arm portion 31 continuously along the longitudinal direction L as the extending direction of the vibrating arm portions 30 and 31 respectively.

As shown in FIG. 5, a pair of mount electrodes 38A and 38B are provided on one surface 33a (hereinafter referred to as a "mount surface") of two surfaces of the support arm portion 33 facing in a thickness direction as mount portions used when the piezoelectric vibrating piece 3 is mounted on the package 2. The pair of mount electrodes 38A and 38B are arranged at an interval in the longitudinal direction L, in which the first mount electrode 38A is arranged on the base end side of the support arm portion 33 and the second mount electrode 38B is arranged on the tip side of the support arm portion 33. In the embodiment, the two mount electrodes 38A and 38B are smaller than a width dimension of the support arm portion 33, which are each arranged in the center of the support arm portion 33 in the width direction W.

Figure 7:
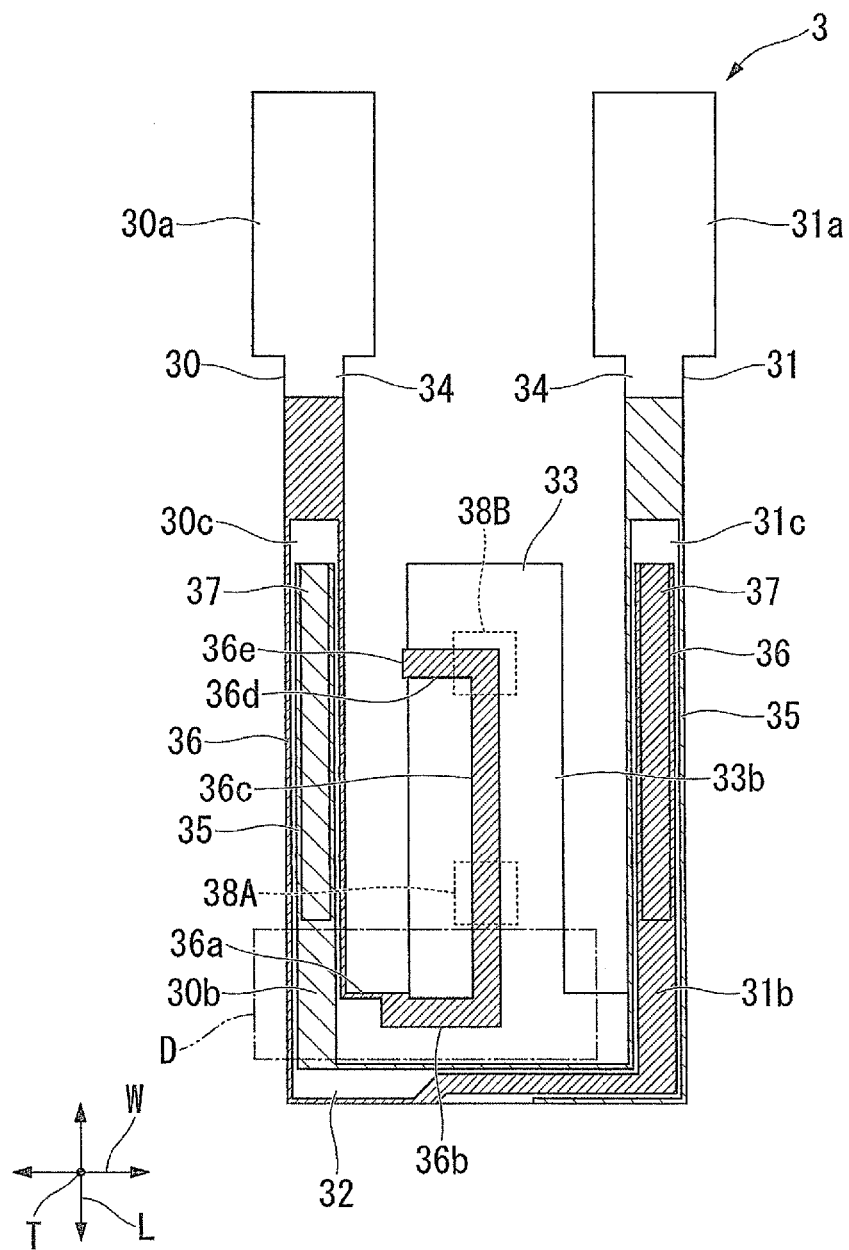
FIG. 7 is a plan view of an opposite-mount surface side of the piezoelectric vibrating piece according to the embodiment of the present invention.

FIG. 7 is a plan view of an opposite-mount surface side of the piezoelectric vibrating piece.

As shown in FIG. 5 and FIG. 7, first system layout electrodes 35a, 35b and second system layout electrodes 36a to 36f respectively connecting respective mount electrodes 38A and 38B to respective systems of excitation electrodes 35 and 36 are provided in a route from the support arm portion 33 to the respective excitation arm portions 30, 31 via the base portion 32.

First, the first system layout electrode will be described.

As shown in FIG. 5, the first system layout electrode is formed of the layout electrode 35a formed on the surface of the base portion 32 and the layout electrode 35b formed along the longitudinal direction in the center of the mount surface 33a of the support arm portion 33 in the width direction W. The first excitation electrode 35 and the first mount electrode 38A are electrically connected through the first system layout electrodes 35a and 35b formed as described above.

Next, second system layout electrodes will be described.

As shown in FIG. 5 and FIG. 7, the second excitation electrode 36 and the second mount electrode 38B are connected through the second system layout electrodes 36a to 36f.

More specific explanation will be made.

Figure 9:
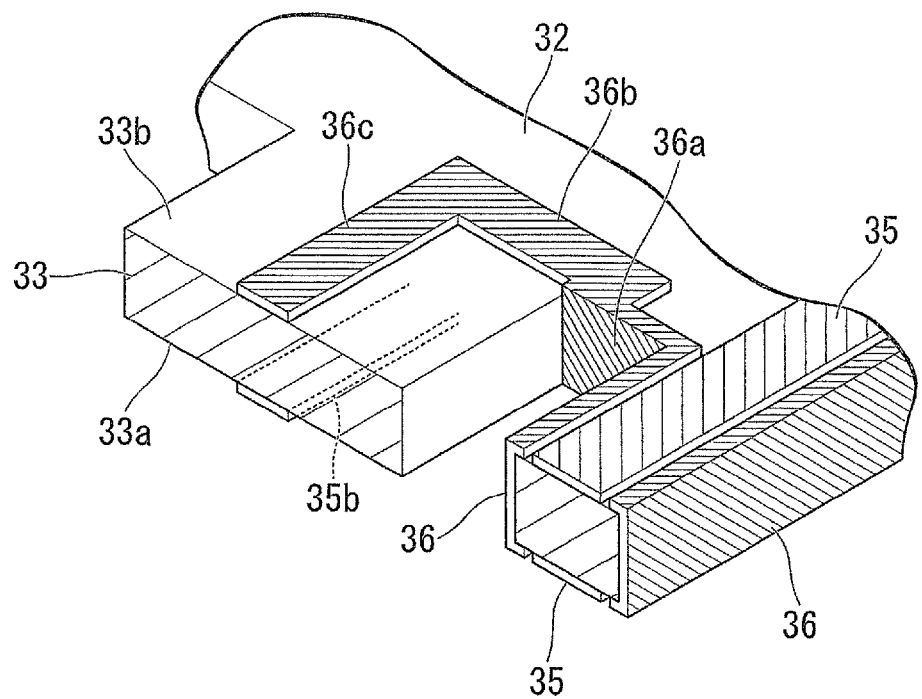
FIG. 9 is an enlarged perspective view of a portion D of FIG. 7.

FIG. 9 is an enlarged perspective view of a portion D of FIG. 7.

As shown in the drawing, the second system layout electrode has the second system layout electrode 36a formed in a range from an side surface inside the vibrating arm portion 30 to an inner side surface of the base portion 32. The layout electrode 36b extending in the width direction W of the support arm portion 33 is formed on the other surface 33b (hereinafter, the surface is referred to as an "opposite mount surface") of the support arm portion 33 so as to continue from the layout electrode 36a. The layout electrode 36c is further formed along the longitudinal direction L at the central portion on the opposite mount surface 33b of the support arm portion 33 in the width direction W.

Figure 8:
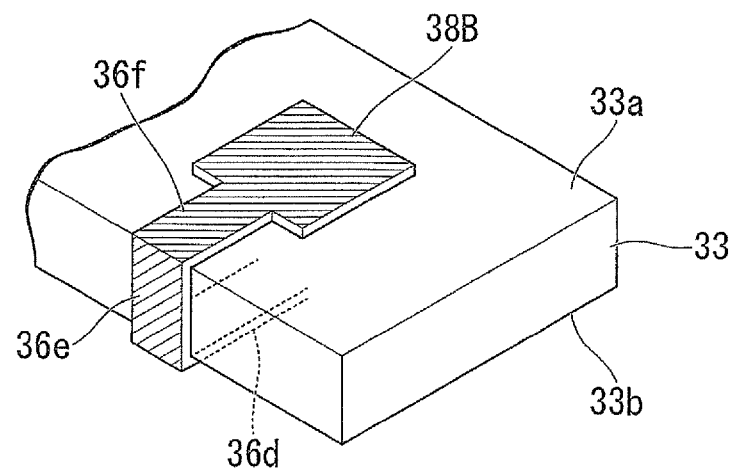
FIG. 8 is an enlarged perspective view of a portion C of FIG. 5.

FIG. 8 is an enlarged perspective view of a portion C of FIG. 5.

As shown in FIG. 8, the second system layout electrode has the layout electrode 36f formed from a point connected to the second mount electrode 36B as a start point so as to extend in the width direction W of the support arm portion 33 on the mount surface 33a. The layout electrode 36e is continuously formed on a side end surface (side surface facing in the width direction) in the width direction of the support arm portion 33 so as to traverse the side end surface in the thickness direction T. Furthermore, the layout electrode 36d is continuously formed so as to bend onto the opposite mount surface 33b of the support arm portion 33. Then, a tip end of the layout electrode 36d is connected to a tip end of the layout electrode 36c extending along the longitudinal direction in the central position in the width direction on the opposite mount surface 33b of the support arm portion 33.

As described above, the second system layout electrode includes the layout electrodes 36a to 36f. In the second system layout electrodes 36b to 36f, at least the layout electrode 36c in an area which passing the vicinity of the first mount electrode 38A is formed on the opposite side of the mount surface 33a, namely, the opposite mount surface 33b side for bypassing the vicinity of the first mount electrode 38A (for bypassing a later-described bonding area P of a conductive adhesive).

A conductive portion from the first mount electrode 38A toward the first excitation electrode 35 via the first system layout electrodes 35a and 35b is formed by continuously patterned. Also, a conductive portion from the second mount electrode 38B toward the second excitation electrode 36 via the second system layout electrodes 36a to 36f is formed by continuously patterned.

Furthermore, an application area (bonding area) P of the conductive adhesive (conductive bonding material) is set on the mount surface 33a of the support arm portion 33 so as to include the first mount electrode 38A as shown in FIG. 5. The application area P in this case is set over the entire area of the mount surface 33a of the support arm portion 33 in the width direction W. Also on the second mount electrode 38 side, an application area (bonding area) of the conductive adhesive (conductive bonding material) including the second mount electrode 38B is set over the entire area of the mount surface 33a of the support arm portion 33 in the width direction W, though not shown.

The piezoelectric vibrating piece 3 having the above structure is housed in the hermetically sealed cavity C of the package 2, and the two mount electrodes 38A and 38B provided on the mount surface 33a of the support arm portion 33 of the piezoelectric vibrating piece 3 are connected electrically and mechanically to the two electrode pads 20A and 20B provided on the mount surface 11a of the second base substrate 11 of the package 2 respectively through the conductive adhesive.

Accordingly, the piezoelectric vibrating piece 3 is supported by the support arm portion 33 in a state of floating from the mount surface 11a of the second base substrate 11, and the base ends 30b, 31b side of the pair of vibrating arm portions 30 and 31 are supported in a cantilever manner through the base portion 32.

Then, when a given voltage is applied to the external electrodes 21A and 21B, electric current flows in the pair of excitation electrodes 35 and 36, and the pair of vibrating arm portions 30 and 31 vibrate, for example, in directions approaching and separating from each other (width direction W) at a given resonance frequency due to the interaction between the excitation electrodes 35 and 36. The vibration of the pair of vibrating arm portions 30 and 31 is used as a time source, a timing source of a control signal, a reference signal source and so on.

As the conductive bonding material for bonding the mount electrodes 38A and 38B to the electrode pads 20A and 20B, metal bumps can be used instead of the conductive adhesive. A common point between the conductive adhesive and the metal bumps is that they are conductive bonding materials having fluidity in an initial stage of bonding and are solidified in a later stage of bonding to develop the bonding strength.

In the piezoelectric vibrating piece 3 and the piezoelectric vibrator 1 having the above structure, the second system layout electrode 36c on the support arm portion 33 connected to the second mount electrode 38B positioned in the tip side of the support arm portion 33 is formed on the other surface (opposite mount surface 33b) in the thickness direction of the support arm portion 33 for bypassing at least the application area P of the conductive adhesive in the first mount electrode 38A (area passing the vicinity of the first mount electrode 38A). Therefore, it is possible to reduce the risk of short circuit between the both mount electrodes 38A and 38B as the conductive adhesive connected to the first mount electrode 38A is squeezed and wet-spread to thereby contact the layout electrode 36c connected to the second mount electrode 38B at the time of bonging the first mount electrode 38A and the second mount electrode 38B to the electrode pads 20A and 20B on the package 2 side respectively through the conductive adhesive. In particularly, when the conductive adhesive for bonding the first mount electrode 38A is squeezed and wet-spread to reach the side end surface of the support arm portion 33 at the time of bonding, the risk that the conductive adhesive connected to the first mount electrode 38A contacts the second system layout electrode 36c can be reduced, therefore, it is possible to increase the strength in mounting with respect to the package 2 while preventing short circuit between the electrodes 38A and 38B.

Moreover, as the second system layout electrodes 36f, 36e and 36d bend onto the other surface (opposite mount surface 33b) of the support arm portion 33 in the thickness direction via the side end surface of the support arm portion 33 in the width direction W, the layout electrodes 36c to 36f can be formed in a reasonable route.

The position of the second system layout electrode 36c formed on the other surface (opposite mount surface 33b) of the support arm portion 33 in the thickness direction is set in the center of the other surface in the width direction. Accordingly, even when the conductive adhesive arranged on one surface (mount surface 33a) reaches the side end surface of the support arm portion 33, the second system layout electrode 36c is positioned at the farthest position from the reaching side end surface. Therefore, the risk of short circuit between the conductive adhesive connected to the first mount electrode 38A and the second system layout electrode 36c can be further reduced.

Furthermore, as the application area P by the conductive adhesive is set in the entire area of the support arm portion 33 in the width direction as described above, the conductive adhesive can be applied to a range of the support arm portion 33 as wide as possible to bond the package 2 to the support arm portion 33. Accordingly, the strength in mounting the piezoelectric vibrating piece 3 with respect to the package 2 can be increased.

In this case, the application area P can be extended to the two side end surfaces in the width direction of the support arm portion 33. According to the structure, the application range of the conductive adhesive is increased and the strength in mounting of the piezoelectric vibrating piece 3 with respect to the package 2 can be further increased.

(Oscillator)

Next, an example of an oscillator using the piezoelectric vibrator according to the embodiment of the present invention will be explained with reference to FIG. 10.

Figure 10:
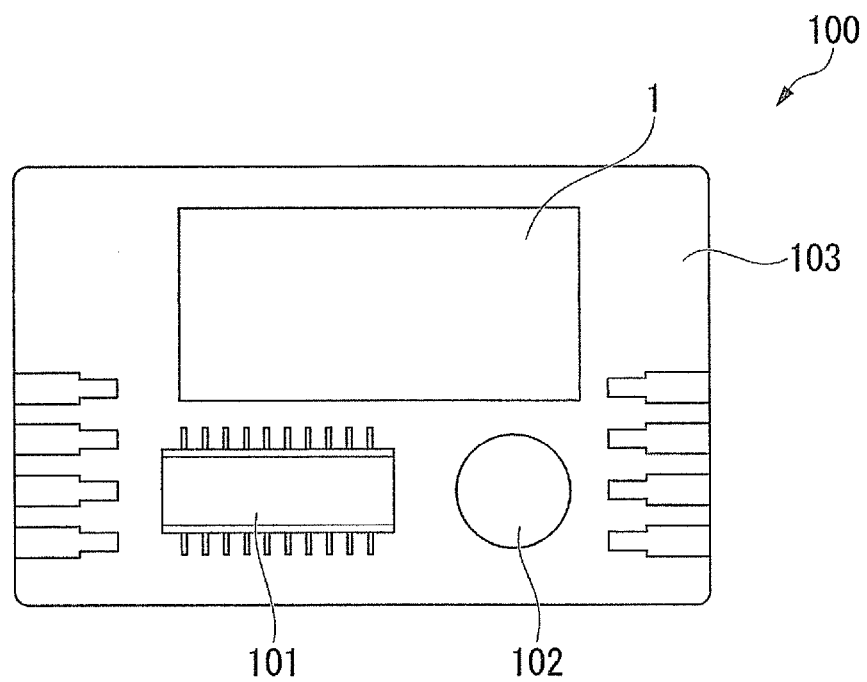
FIG. 10 is a structural view showing an oscillator using the piezoelectric vibrator according to the embodiment of the present invention.

FIG. 10 is a structural view showing an oscillator using the above piezoelectric vibrator.

As shown in the drawing, an oscillator 100 uses the piezoelectric vibrator 1 as a resonator which is electrically connected to an integrated circuit 101.

The oscillator 100 includes a substrate 103 on which an electronic component 102 such as a capacitor is mounted. The above integrated circuit 101 for the oscillator is mounted on the substrate 103, and the piezoelectric vibrator 1 is mounted in the vicinity of the integrated circuit 101. The electronic component 102, the integrated circuit 101 and the piezoelectric vibrator 1 are electrically connected respectively by a not-shown wiring pattern. Respective components are molded by a not-shown resin.

In the oscillator 100 having the above structure, the piezoelectric vibrating piece in the piezoelectric vibrator 1 vibrates when a voltage is applied to the piezoelectric vibrator 1. The vibration is converted into an electric signal by piezoelectric characteristics possessed by the piezoelectric vibrating piece and inputted to the integral circuit 101 as the electric signal. Various processing is performed to the inputted electric signal by the integral circuit 101 to be outputted as a frequency signal. Accordingly, the piezoelectric vibrator 1 functions as the resonator.

In the configuration of the integrate circuit 101, for example, an RTC (real time clock) module or the like is selectively set according to a request, thereby adding functions such as the control of an operation date and time of the device and outer devices, presentation of time or a calendar and so on in addition to a single function oscillator for clocking.

As the oscillator 100 has the piezoelectric vibrator 1 as described above, the oscillator 100 effectively capable of suppressing vibration leakage can be obtained in the same manner.

(Electronic Device)

Next, an example of an electronic device using the piezoelectric vibrator according to the embodiment of the present invention will be explained with reference to FIG. 11.

Figure 11:
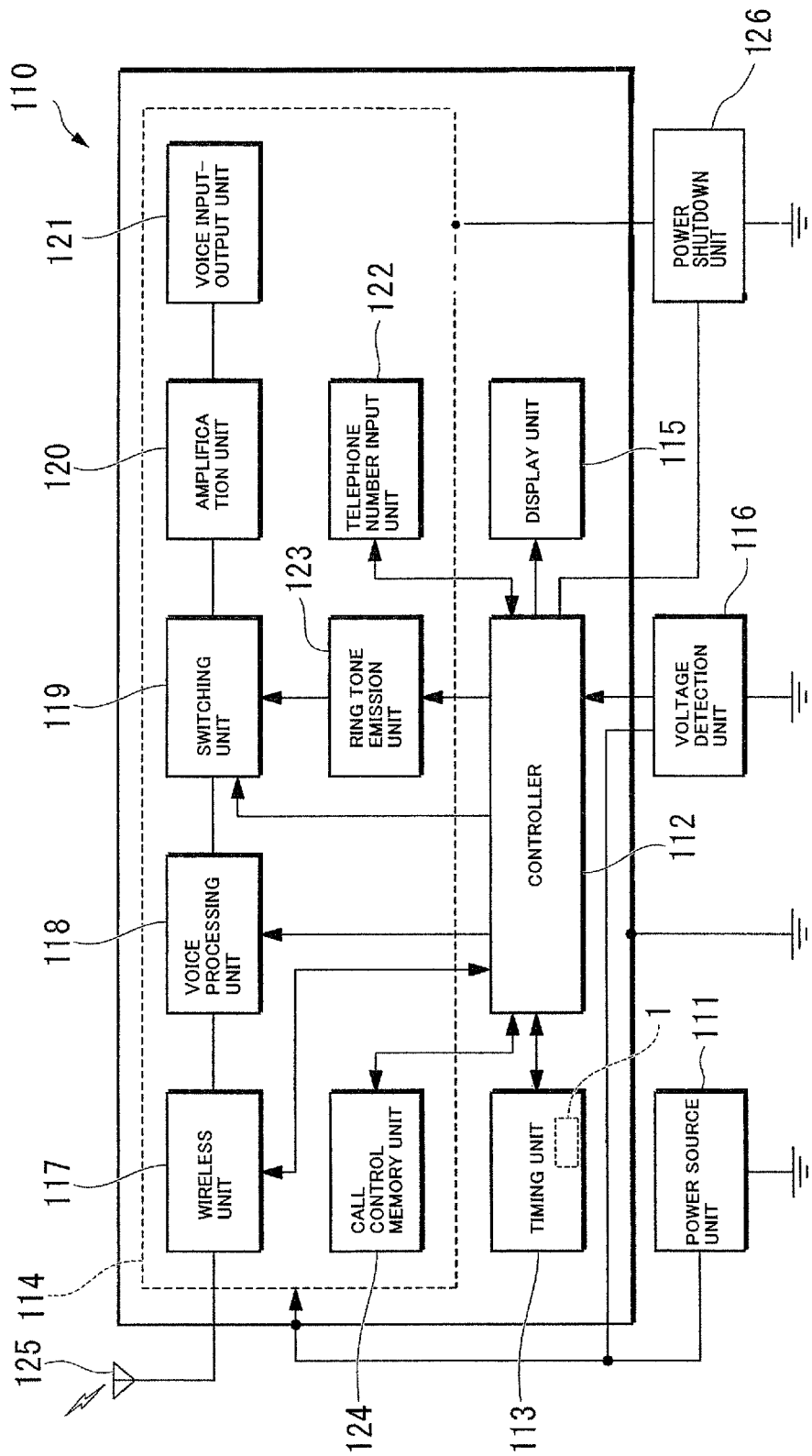
FIG. 11 is a structural view showing an electronic device using the piezoelectric vibrator according to the embodiment of the present invention.

FIG. 11 is a structural view showing an electronic device using the above piezoelectric vibrator.

As shown in the drawing, the electronic device is a portable information device 110 using the piezoelectric vibrator 1, which is typified by, for example, a cellular phone obtained by developing and improving a wrist watch in related art. The device looks like a wrist watch, in which a liquid crystal display is arranged at a portion corresponding to a dial and the current time and so on can be displayed on a screen. When using the device as a communication device, it is possible to perform communication in the same manner as the related-art cellular phone using a speaker and a microphone built in an inner side portion of a band by removing the band from a wrist. However, the device is drastically reduced in size and weight as compared with the related-art cellular phone.

Next, a configuration of the portable information device 110 will be explained. The portable information device 110 includes the piezoelectric vibrator 1 and a power supply unit 111 for supplying the power as shown in FIG. 11. The power supply unit 111 is formed of, for example, a lithium secondary battery. A control unit 112 performing various kinds of control, a timing unit 113 counting the time and so on, a communication unit 114 performing communication with the outside, a display unit 115 displaying various information and a voltage detecting unit 116 detecting voltages of respective functional units are connected to the power supply unit 111 in parallel. Then, the power is supplied to respective functional units by the power supply unit 111.

The control unit 112 controls respective functional units to perform operation control of the entire system such as transmission/reception of audio data, measurement and display of current time. The control unit 112 includes, a ROM in which programs are previously written, a CPU reading and executing the programs written in the ROM, a RAM used as a work area of the CPU and so on.

The timing unit 113 has an integrated circuit including an oscillation circuit, a register circuit, a counter circuit and an interface circuit and the piezoelectric vibrator 1. When a voltage is applied to the piezoelectric vibrator 1, the piezoelectric vibrating piece vibrates, and the vibration is converted into an electric signal by piezoelectric characteristics possessed by crystal to be inputted to the oscillation circuit as the electric signal. An output of the oscillation circuit is binarized and counted by the register circuit and the counter circuit. Then, the signal is transmitted/received with respect to the control unit 112 through the interface circuit, thereby displaying the current time, the current date or calendar information and the like on the display unit 115.

The communication unit 114 has the same functions as those of the related-art cellular phone, including a wireless portion 117, an audio processing unit 118, a switching unit 119, an amplification unit 120, an audio input/output unit 121, a telephone-number input unit 122, an incoming sound generation unit 123 and a call control memory unit 124.

The wireless unit 117 transmits and receives various data such as audio data with respect to a base station through an antenna 125. The audio processing unit 118 encodes and decodes an audio signal inputted from the wireless unit 117 or the amplification unit 120. The amplification unit 120 amplifies the signal inputted from the audio processing unit 118 or the audio input/output unit 121 to a given level. The audio input/output unit 121 includes a speaker, a microphone and the like, which increases the incoming sound and the call volume as well as collects sound.

The incoming sound generation unit 123 generates the incoming sound in accordance with the calling from the base station. The switching unit 119 switches the amplification unit 120 connected to the audio processing unit 118 to the incoming sound generation unit 123 only when a call is coming, thereby outputting the incoming sound generated in the incoming sound generation unit 123 to the audio input/output unit 121 through the amplification unit 120.

The call control memory unit 124 stores programs relating to the control of call transmission/reception in the communication. The telephone-number input unit 122 includes, for example, number keys from 0 (zero) to 9 and other keys, and a telephone number of a call destination is inputted by pressing the number keys and so on.

The voltage detecting unit 116 detects a voltage reduction and notifies the control unit 112 of the reduction when the voltage added to respective functional units such as the control unit 112 by the power supply unit 111 is reduced to be lower than a given value. The given voltage value at this time is a predetermined value as a minimum necessary voltage for stably operating the communication unit 114, which is, for example, approximately 3V. The control unit 112 which has received the notification of voltage reduction from the voltage detecting unit 116 inhibits operations of the wireless unit 117, the audio processing unit 118, the switching unit 119 and the incoming sound generation unit 123. In particular, it is essential to stop the operation of the wireless unit 117 with high power consumption. Furthermore, a notice indicating that the communication unit 114 is inoperable due to shortage of a battery remaining amount is displayed in the display unit 115.

That is, the operation of the communication unit 114 can be inhibited and the fact can be displayed in the display unit 115 by the voltage detecting unit 116 and the control unit 112. The display may be a massage of letters as well as may be performed by putting a mark "X" on a telephone icon displayed on an upper part of a display surface in the display unit 115 as a more instinctive display.

Note that a power shutdown unit 126 which can selectively shut down the power at a portion relating to the function of the communication unit 114 is provided to thereby stop the function of the communication unit 114 more positively.

As the portable information device 110 has the above piezoelectric vibrator 1 as described above, the portable information device 110 which can suppress the vibration leakage effectively can be obtained in the same manner.

(Radio Timepiece)

Next, a radio timepiece using the piezoelectric vibrator according to the embodiment of the present invention will be explained with reference to FIG. 12.

Figure 12:
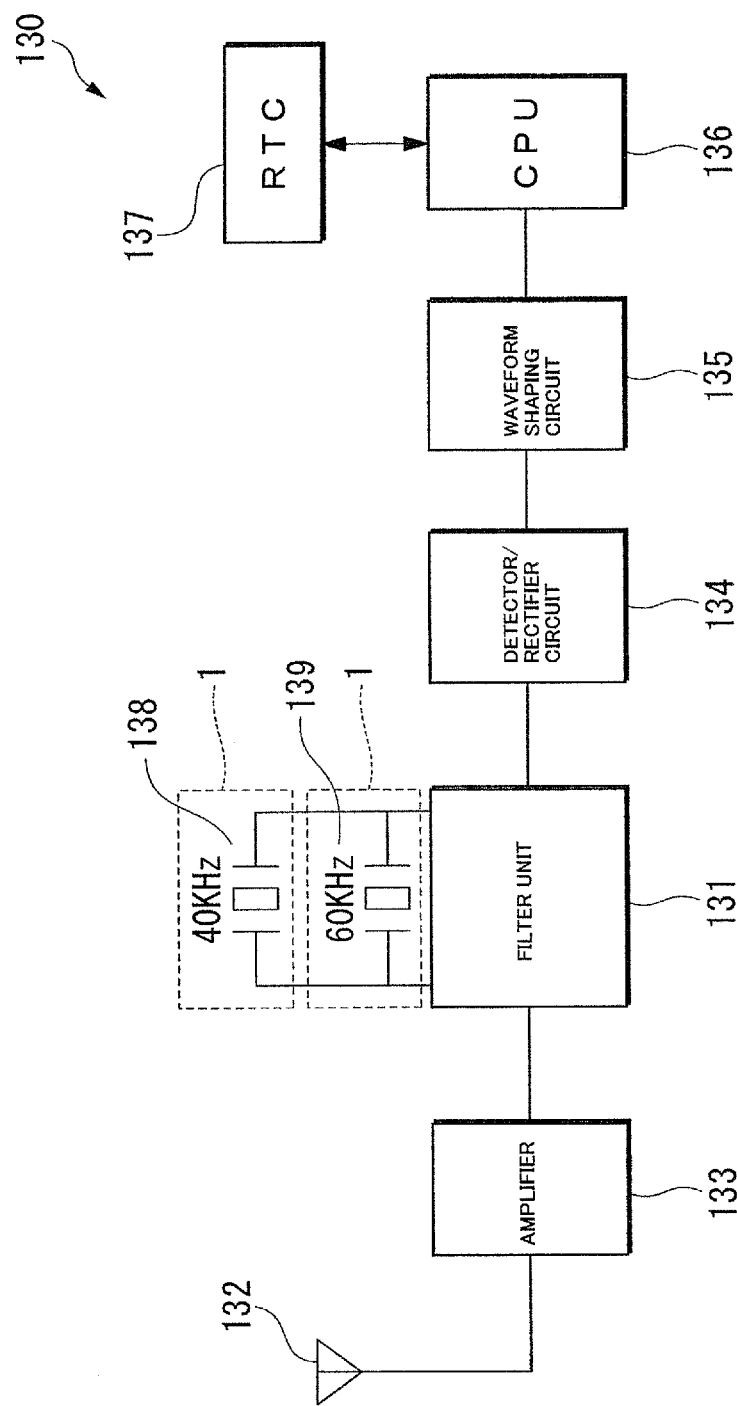
FIG. 12 is a structural view showing a radio timepiece using the piezoelectric vibrator according to the embodiment of the present invention.

FIG. 12 is a structural view showing a radio timepiece using the above piezoelectric vibrator.

As shown in the drawing, a radio timepiece 130 has the piezoelectric vibrator 1 electrically connected to a filter unit 131, which is a time piece having functions of receiving a standard wave including timepiece information and displaying the precise time after automatic correction.

In Japan, transmitting stations transmitting standard waves exist in Fukushima prefecture (40 kHz) and Saga prefecture (60 kHz), which transmit standard waves respectively. Long waves such as 40 kHz and 60 kHz have both a characteristic of propagating on the ground surface and a characteristic of propagating while being reflected on the ionosphere and the ground surface, therefore, the propagation range is wide enough to cover the entire Japan by the above two transmitting stations.

Hereinafter, a functional configuration of the radio timepiece 130 will be explained in detail.

The antenna 132 receives a long standard wave of 40 kHz or 60 kHz. The long standard wave includes time information called a time code, which is obtained by amplitude-modulating a carrier wave of 40 kHz or 60 kHz. The received long standard wave is amplified by an amplifier 133 and filtered/synchronized by a filter unit 131 having plural piezoelectric vibrators 1.

The piezoelectric vibrator 1 used for the radio timepiece 130 has quartz crystal units 138 and 139 having resonance frequencies of 40 kHz and 60 kHz which are the same as the above-described carrier frequencies, respectively.

The filtered signal with the given frequency is detected and demodulated by a detection/rectifier circuit 134. Subsequently, the time code is taken out through a waveform shaping circuit 135 and counted by a CPU 136. In the CPU 136, information such as a current year, cumulative days, a day of the week, time is read. The read information is reflected on an RTC 137, and precise time information is displayed.

As the carrier waves are 40 kHz and 60 kHz, it is preferable to use the above vibrator having the tuning-fork type structure as the quartz crystal units 138 and 139.

Although the above explanation has been made by citing the example of Japan, frequencies of long standard waves differ in foreign countries. For example, a standard wave of 77.5 kHz is used in Germany. Accordingly, when the radio timepiece 130 which can be used in foreign countries is incorporated in portable devices, the piezoelectric vibrator 1 having a frequency different from that of Japan is necessary.

As the radio timepiece 130 has the above piezoelectric vibrator 1 as described above, the radio timepiece 130 which can suppress the vibration leakage effectively can be obtained in the same manner.

The embodiments of the present invention have been explained with reference to the drawings, however, specific configurations are not limited to these embodiments and design change in a range not departing from the gist of the present invention and so on are included.

For example, the base substrate is formed of two substrates of the first base substrate 10 and the second base substrate 11 in the above embodiment, however, the base substrate may be formed of one substrate and the concave portion 40 is formed on the mount surface 11a. However, it is preferable that the base substrate is formed of two substrates of the first base substrate 10 and the second base substrate 11. In this case, the concave portion 40 can be easily formed by bonding both base substrates after forming a through hole in the second base substrate 11, therefore, the process and time for forming the concave portion can be reduced.

Also in the explanation of the above embodiment, the application area at the time of bonding the mount electrodes 38A and 38B to the electrode pads 20A and 20B by using the conductive adhesive is the entire area in the width direction of the support arm portion 33. However, this does not always mean that the adhesive is applied to the entire area in the width direction of the support arm portion 33. It is naturally preferable that the adhesive is applied to the entire area in the width direction of the support arm portion 33 to set the entire area of the width direction to the application area, however, there is a case where the adhesive is squeezed and spread to the entire area of the width direction at the time of mounting, and resultantly the entire area of the width direction becomes the application area even when the application is not performed to the entire area of the width direction. Accordingly, the application region of the conductive adhesive is not particularly prescribed.

In view of the above, in the above-explained piezoelectric vibrating piece 3, the second system layout electrode 36c on the support arm portion 33 connected to the second mount electrode 38B positioned in the tip side of the support arm portion 33 is formed on the other surface (opposite mount surface 33b) in the thickness direction of the support arm portion 33 for bypassing at least the application area P of the conductive adhesive in the first mount electrode 38A (area passing the vicinity of the first mount electrode 38A), however, the application area P indicates an area of the entire range where the conductive adhesive is supposed to be wet spread. In other words, the second system layout electrode 36c is formed on the other surface (opposite mount surface 33b) in the thickness direction of the support arm portion 33 so as to avoid the contact with respect to the conductive adhesive.

It is also possible to form the concave portion in an side portion in the width direction of the base end side of the vibrating arm portions 30 and 31 of the piezoelectric vibrating piece 3 or a side portion in the width direction of the base end side of the support arm portion 33 to thereby easily attenuate the vibration transmitted from the vibrating arm portions 30 and 31 to the support arm portion 33. Accordingly, vibration leakage (leakage of vibration energy) from the piezoelectric vibrating piece 3 to the package 2 side can be prevented and the resonance frequency of the piezoelectric vibrating piece 3 can be stabilized.

What is claimed is:

1. A piezoelectric vibrating piece comprising:
   a pair of vibrating arm portions;
   a base portion to which respective base end sides of the pair of vibrating arm portions are fixed;
   a support arm portion connected to the base portion between the pair of vibrating arm portions and extending from the base portion to a tip end on a same side as the pair of vibrating arm portions;
   first and second excitation electrodes on each of the pair of vibrating arm portions;
   first and second mount electrodes displaced at an interval in a longitudinal direction of the support arm portion on a mount surface of the support arm portion, the first and second mount electrodes bonded to respective first and second electrode pads on a substrate by a conductive adhesive; and
   first and second layout electrodes connecting the first and second mount electrodes, respectively, to the first and second excitation electrodes via the base portion,
   wherein the second layout electrode connects to the second mount electrode near the tip end of the support arm portion and traverses from the mount surface to an opposite surface of the support arm portion via a side surface of the support arm portion and traverses the opposite surface of the support arm portion to connect the second mount electrode to the second excitation electrode.

2. The piezoelectric vibrating piece according to claim 1, wherein the second layout electrode traverses an area on the opposite surface of the support arm portion facing the conductive adhesive of the first mount electrode to connect the second mount electrode and the second excitation electrode.

3. The piezoelectric vibrating piece according to claim 1, wherein the conductive adhesive for bonding to the first mount electrode is bonded to an entire area in a width direction of the support arm portion.

4. The piezoelectric vibrating piece according to claim 1, wherein the first mount electrode is formed over the entire area of the support arm portion in a width direction on the mount surface of the support arm portion.

5. The piezoelectric vibrating piece according to claim 1, wherein the conductive adhesive is bonded to the side surface of the support arm portion in addition to the mount surface of the support arm portion.

6. A piezoelectric vibrator in which the piezoelectric vibrating piece according to claim 1 is housed in a hermetically sealed cavity of a package, wherein the first and second mount electrodes are bonded by the conductive adhesive to the first and second electrode pads on the substrate within the cavity.

* * * * *